June 10, 1958 B. B. BYCER 2,838,660

AUTOMATIC GAIN CONTROL SYSTEMS

Filed April 5, 1955 3 Sheets-Sheet 1

INVENTOR.
BERNARD B. BYCER
BY Edward M. Farrell
ATTORNEY

June 10, 1958 B. B. BYCER 2,838,660

AUTOMATIC GAIN CONTROL SYSTEMS

Filed April 5, 1955 3 Sheets-Sheet 2

INVENTOR.
BERNARD B. BYCER
BY Edward M. Farrell
ATTORNEY

June 10, 1958 B. B. BYCER 2,838,660

AUTOMATIC GAIN CONTROL SYSTEMS

Filed April 5, 1955 3 Sheets-Sheet 3

INVENTOR.
BERNARD B. BYCER
BY Edward M. Farrell
ATTORNEY

United States Patent Office 2,838,660

Patented June 10, 1958

2,838,660

AUTOMATIC GAIN CONTROL SYSTEMS

Bernard B. Bycer, Philadelphia, Pa., assignor to Tele-Dynamics Inc., a corporation of Pennsylvania Application April 5, 1955, Serial No. 499,435

8 Claims. (Cl. 250—20)

This invention relates to radio receivers and more particularly, to automatic gain control circuits employed in such radio receivers.

Many automatic gain control circuits utilize the principle of detecting the voltage output of an intermediate frequency amplifier stage and deriving therefrom a direct voltage which is proportional to the output of the detector. This direct voltage is fed back to one or more prior intermediate or radio frequency amplifiers in the form of a variable bias such that when the incoming signal is strong, the bias is fairly large, whereas, when the incoming signal is weak, the bias is very small. Such automatic gain control circuits maintain the radio frequency signal supplied to the final detector substantially constant over a wide range of variations in the amplitude of the received signal.

Very often, it is desirable to prevent application of the gain control voltage and the consequent reduction in gain of the previous amplifiers during the reception of weak signals. A biased rectifier is often used which remains inoperative until the signal applied thereto exceeds a certain amplitude determined by the amount of bias. This is usually referred to as an amplitude delay or delayed automatic gain control. In receivers so equipped, the gain is maximum for received signals below the threshold value of the automatic gain control circuit as determined by the delay bias. For signals above the threshold level, the automatic gain control circuit functions to hold the average value of the radio frequency signal applied to the final detector substantially constant at a value near or slightly above the threshold value of the automatic gain control circuit, depending upon its sensitivity.

In an intermediate freqeuncy coupling network having tuned primary and secondary circuits the introduction of means to produce an automatic gain control voltage in either of the circuits produces an unbalanced load relationship between the two circuits. Such an unbalanced load relationship causes the primary and secondary circuits to have different frequency response characteristics with each circuit passing a slightly different band of frequencies. When an electrical signal is applied to the unbalanced coupling network widening of the band pass or frequency band on one side results. This widening of the frequency band not only causes a shift in the center frequency of the band pass but, in addition, permits undesired signals to pass through the coupling network.

A widening of the frequency bandwidth is especially likely to occur when unusually strong electrical signals are applied to the intermediate frequency coupling network. Very often, existing automatic gain control circuits are not adequate to supply sufficient bias voltage to reduce the amplification of such strong signals prior to their application to the coupling network. The widening or spread of the frequency bandwidth resulting from the strong electrical signals again permits undesired signals to pass through the coupling network.

In many cases, the automatic again control circuit is associated with the final detection circuit. In this case, the radio or intermediate frequency signal is demodulated thereby making the signal unavailable for application to subsequent amplifier stages or other utilization circuits. In many radio receivers, it is desired to incorporate the automatic gain control circuit in one of the intermediate frequency stages and, at the same time, pass a signal with its intelligence unaltered at its intermediate frequency to a subsequent stage. For example, in double conversion receivers, two different intermediate frequencies are involved. In many instances, it may be desirable to have an automatic gain control circuit associated with one of the intermediate frequency stages tuned to one of the frequencies and, at the same time, pass the same intermediate frequency signal to a subsequent mixer stage to produce the second intermediate frequency within the receiver.

In some types of radio receivers, it may be desirable to have a first automatic gain control voltage, which is continuously applied to a preceding amplifier stage or stages during the reception of electrical signals of unusual strength. The additional control voltage may be applied to control the gain of the same or different amplifier stage or stages controlled by the first automatic gain control voltage. For example, the first automatic gain control voltage may be applied to a preceding intermediate frequency amplifier stage and the additional delayed control voltage applied to a preceding radio frequency amplifier stage. The combining of the first and the additional control voltages to produce an additive voltage may also be desirable. Such an additive voltage may be applied to the same or different stages to which the individual control voltages are applied.

It is an object of this invention to provide an improved intermediate frequency coupling network having substantially balanced primary and secondary circuits.

It is a further object of this invention to provide an improved automatic gain control system associated with a balanced intermediate frequency coupling network.

It is still a further object of this invention to provide a novel circuit arrangement wherein a radio frequency signal used to produce an automatic gain control voltage may also be applied to a subsequent utilization circuit substantially unaltered in form.

It is still a further object of this invention to provide an improved automatic gain control circuit wherein a "voltage doubling" or increase of the gain control voltage is attained.

It is still a further object of this invention to provide an improved delayed automatic gain control circuit.

It is still a further object of this invention to provide an improved automatic gain control circuit in which a plurality of control voltages may be applied to a plurality of circuits, with at least one of the control voltages being delayed.

It is still a further object of this invention to provide an improved automatic gain control circuit wherein a "voltage doubling" action is achieved with a minimum number of vacuum tubes or other electron discharge devices.

It is still a further object of this invention to provide an improved automatic gain control circuit wherein a "voltage doubling" action is achieved and wherein an intermediate frequency coupling circuit is substantially balanced during the reception of relatively strong signals.

In accordance with the present invention, an intermediate frequency coupling network includes a tuned primary and a tuned secondary circuit. Rectifying means are provided in each of the tuned circuits to maintain a balanced relationship therebetween whereby the center frequency of the coupling network remains substantially unchanged for wide variations in signal strength. The output voltages from the rectifying means, resulting from a positive signal applied to the coupling network, are combined to provide a "voltage doubling" action. The increased, or doubled, voltage is applied to a preceding amplifier stage or stages to control the gain. The additional control provided maintains the bandwidth of the coupling network substantially constant. An electrical signal from the tuned secondary circuit may be applied to a subsequent utilization circuit substantially unaltered in form by the automatic gain control circuit.

Other objects and advantages of the present invention will be apparent and suggest themselves to those skilled in the art to which the invention is related, from a reading of the following specification in connection with the drawings, in which.

Figure 1:
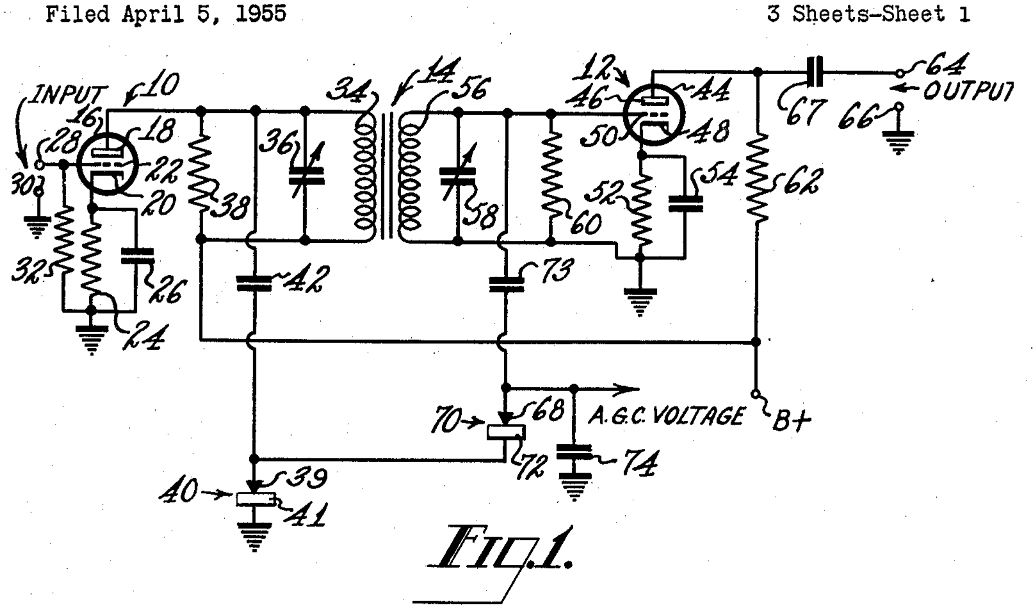
Figure 1 is a schematic circuit diagram of an improved coupling and gain control system, in accordance with the present invention.

Referring particularly to Figure 1, a pair of amplifier stages 10 and 12 are inductively coupled through a transformer 14.

The first amplifier stage 10 includes an electron discharge device 16 having a nanode 18, a cathode 20 and a control grid 22. A resistor 24 and a capacitor 26 provide self biasing means for the device. A pair of input terminals 28 and 30 is provided to receive an input electrical signal across an input load resistor 32. Input terminal 30 is connected to a point of reference potential, hereinafter referred to as ground. The output circuit of the electron discharge device 16 includes an inductance in the form of a primary winding 34 of the transformer 14. A variable capacitor 36 is connected across the primary winding 34 to provide a parallel resonant circuit tuned to a desired frequency. A resistor 38 is connected across the parallel resonant circuit including the primary winding 34 and the capacitor 36 to provide damping means for the resonant circuit. The anode 18 is connected to a source of operating potential, designated as B+, through the resistor 38 and the primary winding 34.

The output circuit of the electron discharge device 16 is connected to the anode 39 of a rectifying means or diode 40 through a coupling capacitor 42. The cathode 41 of the diode 40 is connected to ground.

The signal developed across the primary winding 34 in the output circuit of the first amplifier stage 10 is inductively coupled to the second amplifier stage 12. The second stage includes an electron discharge device 44 having an anode 46, a cathode 48 and a control grid 50. A resistor 52 and a capacitor 54 provide self biasing means for the device 44. The input circuit of the device 44 includes an inductance in the form of a secondary winding 56 of the transformer 14. A variable capacitor 58 is connected across the secondary winding to provide a parallel resonant circuit therewith tuned to a desired frequency. A resistor 60 is connected across the tuned parallel resonant circuit to provide damping means. The resistor 60 further provides a load and grid return for the input circuit of the electron discharge device 44. The anode 46 is connected to B+ through a load resistor 62. The output signal from the amplifier stage 12 is applied across a pair of output terminals 64 and 66 through a coupling capacitor 67.

The input circuit of the electron discharge device 44 is connected to the anode 68 of a rectifying means or diode 70 through a coupling capacitor 73. The cathode 72 of the diode 70 is connected to the anode 39 of the diode 40. The space charge paths of the diodes 40 and 70 are thus effectively connected in series. A voltage storing means or capacitor 74 is connected across the two diodes 70 and 40 between the anode 68 and ground.

In considering the operation of the circuit shown, an electrical signal is applied to the input terminals 28 and 30. This signal may be, for example, a signal from a previous intermediate frequency amplifier stage. The applied signal is amplified by the electron discharge device 16 with the amplified signal being applied to the transformer 14. The primary and secondary windings 34 and 56, respectively, may be tuned to resonant at the desired intermediate frequency of the receiver. The intermediate frequency signal is then applied to the second amplifier stage 12 with the amplified signal from this stage being applied to the output terminals 64 and 66. These output terminals may, in turn, be connected to another intermediate amplifier, a mixer stage or any other suitable utilization circuit.

Associated with the coupling network or transformer 14 is circuit means for providing a suitable automatic direct current gain control voltage. The electrical signal across the primary winding 34 of the output circuit is applied to the diode 40 through the capacitor 42. It is seen that when the signal applied to the anode 39 is in a positive direction with respect to ground, the diode 40 conducts. The current through the diode 40 causes the bottom plate of the capacitor 42 to assume a negative potential, since electrons flow away from the top plate of the capacitor and towards its bottom plate through the diode. When the signal across the primary winding 34 is negative, the diode 40 is non-conducting.

The electrical signal across the secondary winding 56, in the input circuit of the amplifier stage 12, is applied to the diode 70 through the coupling capacitor 73. When the signal applied to the anode 68 is in a positive direction with respect to ground, the diode 70 conducts. The current through the diode 70 causes the bottom plate of the capacitor 73 to assume a negative potential, since the bottom plate receives electrons from the top plate of the capacitor 73 through the diode 70. At the same time that a positive signal causes the diode 70 to conduct, the capacitor 42 discharges through the diode 70. Thus, it is seen that the bottom plate of the capacitor 73, in effect, acquires two charges. One of the charges is acquired from the current through the diode 70 caused by the positive signal applied thereto. The second charge results from the current flow through the diode 70 resulting from the negative charge accumulated on the bottom plate of the capacitor 42. The diode 70 is nonconducting when the signal applied thereto is negative.

A voltage storing means or capacitor 74 is connected across the two diodes 40 and 70. Since the top plate of the capacitor 74 is connected to the bottom plate of the capacitor 73, these two plates assume the same amount of charge or potential.

It is seen that the voltage built up across the capacitor 74 is substantially double the voltage which would be built up if a single diode with its associated coupling capacitor were used.

The present invention embodied in the circuit shown offers numerous advantages in many types of radio receivers where it is desirable to utilize an automatic gain control circuit in one of the intermediate frequency amplifier stages, such as the one illustrated. For example, in many prior art receivers, the automatic gain control circuit is introduced in either the primary or secondary circuits of the intermediate frequency coupling transformer. This arrangement often produces an unbalanced relationship between the loads of the primary and secondary tuned circuits. If the intermediate frequency coupling transformer is designed to pass a band of frequencies having a predetermined center frequency, as is common practice, such an unbalance introduces undesirable effects in the receiver. For example, in the presence of unusually strong signals, the bandwidth of the coupling transformer will widen. With an unbalanced relationship existing between the primary and secondary circuits, the frequency band will tend to widen more on one side of the band than on the other. Consequently, the center frequency of the frequency band will vary when signals of varying strengths are applied to the intermediate frequency transformer.

A balanced load between the primary and secondary circuits is attained in the present invention by the insertion of a diode in both the primary and secondary circuits of the coupling network. This balancing arrangement assures that the center frequency of the band will remain substantially unchanged in the event that the frequency band tends to widen in the presence of unusually strong signals.

If the frequency band of the intermediate frequency transformer or other coupling network within a receiver widens one or both sides of the band, undesirable signals outside the band of desired frequencies will often pass through the receiver. The likelihood of such a widening of the frequency band of the coupling network, and consequently passage of undesired signals, is reduced considerably by the novel voltage doubling arrangement embodied in the present invention which provides the automatic gain control voltage. The additional voltage provided by the arrangement embodying the present invention is more effective in controlling the amplification of unusually strong signals in stages prior to the intermediate frequency stage incorporating the control circuit. Thus it is seen that the diodes in the primary and secondary circuits serve the dual purpose of balancing loads of the circuits and also of providing additional control voltage.

It is noted that resistors 38 and 60 are connected across windings 34 and 56, respectively, to provide damping means. Such damping means are often used to attenuate the peaks within resonant circuits, thereby providing a frequency band pass circuit with a relatively flat top frequency response. Wide band pass frequency circuits are especially applicable to frequency modulated receivers where the information signal is used to frequency modulate a carrier frequency over a relatively wide frequency band. In utilizing the present invention, it may be desirable to eliminate these resistors. In such a case, the diodes connected across the windings may act as the damping means together with other associated components within the circuit to provide the necessary attenuation and band pass response within the coupling circuit.

Very often, an automatic gain control voltage is developed in a circuit closely associated with a demodulation circuit. For this reason, it is often impractical to further utilize the carrier or intermediate frequency signal after developing the automatic gain control voltage. One of the features of the present invention is that the automatic gain control voltage is attained without demodulating the incoming signal to the receiver. Consequently, the signal may be applied to further amplifier stages. In double conversion receivers, the signal may be applied to a subsequent mixer stage.

In some cases, it may be desirable to introduce a delay in the application of the gain control voltage. In this case, the diodes 40 and 70 may be provided with a positive bias voltage to prevent conduction until signals of predetermined signal strengths are received. The positive voltage may be provided by a battery or developed by other conventional means.

Figure 2:
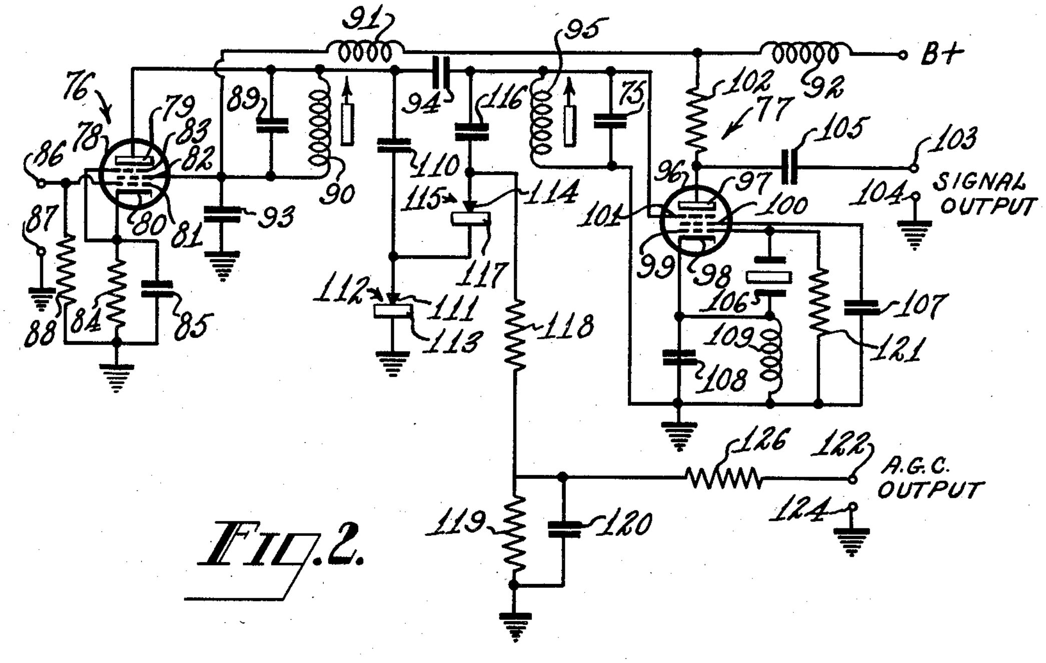
Figure 2 is a schematic circuit diagram of a modification of the coupling and automatic gain control system, illustrated in Figure 1.

Referring particularly to Figure 2, there is shown an intermediate frequency amplifier stage 76 and a signal mixer stage 77. The amplifier stage includes an electron discharge device in the form of a pentode tube 78 comprising an anode 79, a cathode 80, a control grid 81, a screen grid 82 and a suppressor grid 83 externally connected to the cathode. A resistor 84 and a capacitor 85 provide self-biasing means for the pentode tube. A pair of input terminals 86 and 87 are provided to receive an electrical signal which is applied across a load resistor 88 included in the input circuit of the pentode. The output circuit of the pentode tube 78 includes a first tuned parallel resonant circuit having a capacitor 89 and a coil 90, the inductance of which may be varied by varying the position of a metal slug associated therewith. The screen 82 is connected to the source of operating potential through choke windings or coils 91 and 92. A capacitor 93 provides a signal by-pass for the screen circuit. The anode 79 is connected to the source of operating potential through the coils 90, 91 and 92.

A signal developed across the first tuned resonant circuit including the capacitor 89 and the coil 90 is coupled through a capacitor 94 to a second tuned parallel resonant circuit including a capacitor 75 and a variable inductance or coil 95 connected in the input circuit of the mixer stage 77. The mixer stage includes a pentode tube 96 having an anode 97, a cathode 98, grids 99, 100 and 101. The anode 97 is connected to the source of operating potential through a load resistor 102. The signal output from the pentode 96 is applied to a pair of output terminals 103 and 104 through a capacitor 105. The oscillator portion of the mixer stage includes the grids 99, 100 and the cathode 98. A crystal 106 is connected between the grid 99 and the cathode 98. A capacitor 107 is connected between the grid 100 and ground. A tuned circuit comprising a capacitor 108 and a coil 109 is connected between the cathode 98 and ground.

An automatic gain control circuit includes a coupling capacitor 110 from the first tuned parallel circuit, which includes the capacitor 89 and the coil 90, to the anode 111 of the diode or other rectifying means 112. The cathode 113 of the diode is connected to ground.

The output signal from the second tuned parallel circuit, which includes the capacitor 75 and the coil 95, is applied to the anode 114 of the diode 115 through the capacitor 116. The cathode 117 of the diode 115 is connected to the anode 111 of the diode 112.

A coupling or isolating resistor 118 is connected from the anode 114 to a filter network including a resistor 119 and a capacitor 120. The capacitor 120 may be considered as a voltage storing means. A voltage developed across the capacitor 120 is applied to a pair of automatic gain control output terminals 122 and 124 through a coupling or isolating resistor 126.

In considering the operation of this circuit, an electrical signal which may, for example, be from a preceding radio or intermediate frequency amplifier stage is amplified in the stage 76. The amplified signal is capacitively coupled to the mixed stage 77. The amplified signal is applied across the grid 101 and ground and mixed with an oscillator signal to produce a signal frequency in the output circuit of the pentode 96, which may, for example, be the difference between the applied and the oscillator signal frequencies.

The oscillator portion of the circuit is a modified Hartley type with the crystal 106 serving as a tank circuit in the input circuit between the grid 99 and the cathode 98. The capacitor 107 is connected from the grid 100, which acts as an anode for the oscillator portion of the circuit, to ground. The tuned circuit including the capacitor 108 and a coil 109 may be considered as part of the output circuit between the grid 99 and cathode 98. This tuned circuit is tuned to a slightly higher frequency than the frequency of the crystal 106 thereby providing, in effect, an inductive feedback. This tuned circuit provides feedback means to sustain oscillations within the crystal 106. A resistor 121 is connected between the grid 99 and ground to improve the operation and feedback arrangement of the oscillator.

The operation of the automatic gain control portion of the circuit is substantially similar to the operation of the circuit shown and described in connection with Figure 1. When a positive signal from the first tuned parallel circuit is applied to the diode 112 through the capacitor 110, the diode conducts causing a negative charge or potential to exist at the bottom plate of the capacitor 110. When the signal applied to the diode 112 is negative, no conduction within the diode or charging of the capacitor 110 occurs.

When a positive signal from the second tuned parallel circuit is applied to the diode 115 through the capacitor 116, the diode conducts causing a negative charge to accumulate on the bottom plate of the capacitor 116. At the same time that the diode 115 is conducting due to the application of a positive signal, the capacitive 110 discharges through the diode 115 thereby adding to the negative charge at the bottom plate of the capacitor 116. A voltage doubling action is, in effect, thereby provided. The top plate of the capacitor 120 is substantially at the same potential as the bottom plate of the capacitor 116, since the two plates are connected together through the resistor 118. Since the voltage across the capacitor 120 is pulsating direct current, the resistor 119 is connected thereacross. The time constant between the resistor 119 and the capacitor 120 is such to assure adequate filtering of the pulsating voltage thereby making the voltage developed across the capacitor 120 suitable for application as an automatic gain control voltage.

The output signal at terminals 103 and 104 may be applied to subsequent intermediate frequency stages. It is noted that the circuit shown is ideally suitable for double conversion type radio receivers. In such receivers, it is desirable to convert an incoming radio frequency signal to a first intermediate frequency signal which is relatively high. After one or more stages of amplification, the first intermediate frequency signal is converted to a second lower intermediate frequency signal. Following this second conversion, several additional amplifier stages may be employed before the detection stage.

The diodes connected in both the first and second parallel tuned resonant circuits assure balanced loading in the coupling network between the amplifier stage 76 and the mixer stage 77. Such balanced loading helps to maintain the center frequency within the coupling network. Substantial spreading or widening of the frequency band due to usually strong incoming signals is prevented by the novel gain control circuit which provides an additional or doubled voltage to amplifier stages preceding the coupling network.

Figure 3:
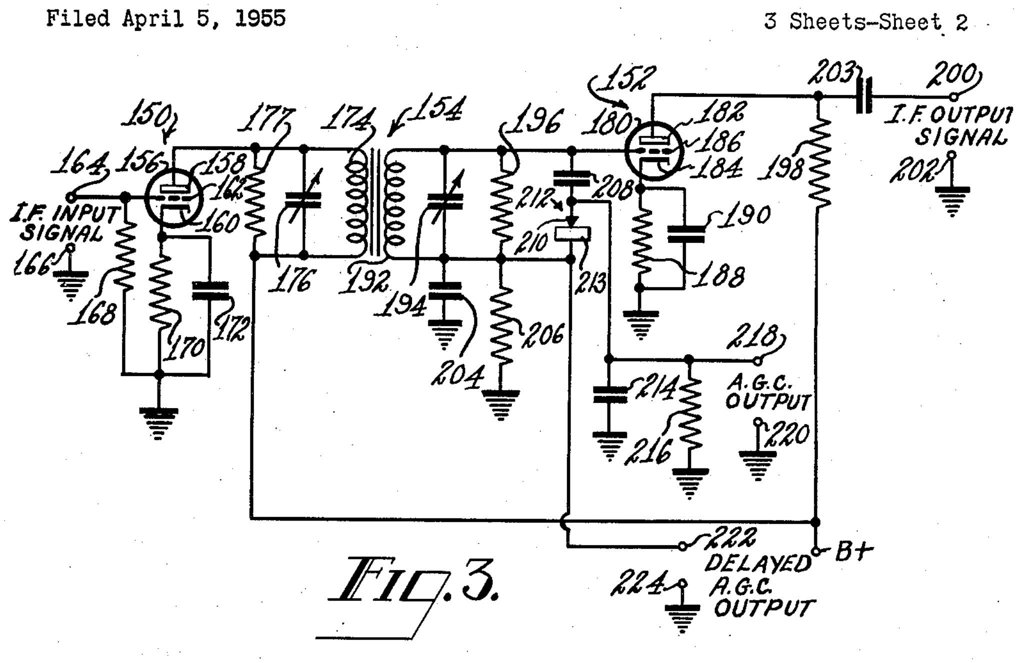
Figure 3 is a schematatc circuit diagram of another modification of an improved automatic gain control system, in accordance with the present invention.

Referring particularly to Figure 3, there is shown schematically another embodiment of the invention. An amplifier stage 150 is inductively coupled to an amplifier stage 152 through a transformer 154.

The amplifier stage 150 includes an electron discharge device 156 having an anode 158, a cathode 160 and a control grid 162. A pair of input terminals 164 and 166 provide means for receiving an electrical signal which is across a grid resistor 168 in the input circuit of the electron discharge device 156. A resistor 170 and a capacitor 172 provide self-biasing means for the device 156. The output circuit of the amplifier stage 150 includes a tuned parallel resonant circuit having the primary winding 174 of the transformer 154 and a variable capacitor 176. Damping means are provided across the resonant circuit by a resistor 177. The anode 158 is connected to a source of operating potential through a resistor 177 and winding 174.

The amplifier stage 152 includes an electron discharge device 180 having an anode 182, a cathode 184 and a control grid 186. A resistor 188 and a capacitor 190 provide self-biasing means for the device 180. The input circuit for the device 180 includes a tuned parallel resonant circuit comprising the secondary winding 192 of the transformer 154, and a variable capacitor 194. A damping resistor 196 is connected across the tuned circuit. The anode 182 is connected to a suitable source of operating potential through a resistor 198. The output circuit from the amplifier stage 152 is connected across a pair of output terminals 200 and 202. These terminals may be connected to any suitable utilization circuit, such as another amplifier stage.

Means for providing an automatic gain control voltage in the input circuit of the device 180 include a capacitor 204 and a resistor 206 connected from the bottom point of the resonant circuit, including the winding 192 and the capacitor 194, and ground. The control grid 186 is coupled through a capacitor 208 to the anode 210 of a diode 212. The cathode 213 is connected to the bottom point of the tuned resonant circuit. A capacitor 214 and a resistor 216 are connected in parallel between the anode 210 and ground. A pair of output terminals 218 and 220 are provided across the resistor 216 and may be connected to an amplifier circuit to control the gain thereof. Likewise, another pair of output terminals 222 and 224 are provided across the resistor 206 and may be connected to provide a delayed automatic gain control of an amplifier stage, as will be described. The pair of terminals 218 and 220 may be connected to a different controlled circuit than the pair of terminals 222 and 224.

During operation of the circuit shown, an electrical signal is applied to the terminals 164 and 166. An amplified signal from the device 156 is coupled through the transformer 154 to the input circuit of the stage 152. The signal to the input circuit is amplified by the device 180 and applied to the output terminals 200 and 202.

In this embodiment of the invention, means are provided for an automatic gain control circuit as well as a circuit for providing an additional delayed automatic gain control.

An electrical signal developed across the secondary winding 192 is applied across the diode 212 through the coupling capacitor 208. When the signal is in the positive direction with respect to ground, the diode 212 conducts. During the conduction of the diode, the bottom plate of the capacitor 208 acquires a negative charge. The top plate of the capacitor 214, being connected to the bottom plate of the capacitor 208, acquires the same amount of charge as said bottom plate. The resistor 216 connected across the capacitor 214 filters the pulsating direct current voltage developed across the capacitor 214 thereby providing a direct current voltage suitable for automatically controlling the gain of an amplifier. This voltage is applied to the terminals 218 and 220.

In the presence of signals applied to the control grid 186, which are strong enough to drive the potential on the grid into a positive range with respect to the cathode, the positive portion of the incoming signal overcomes the negative bias of the electron discharge device 180 provided by the resistor 188 and the capacitor 190. In this event, grid current flows thereby causing the top plate of the capacitor 204 to acquire a negative charge. The voltage or charge developed across the capacitor 204 is filtered by the resistor 206 and applied to the output terminals 222 and 224 for use as a delayed automatic gain control voltage. It is noted that a control voltage appears across the terminals 222 and 224 only when the signals which are applied to the grid 186 are strong enough to overcome the negative bias on the electron discharge device 180.

At the same time that the diode 212 conducts, due to the application of a positive signal, the negative charge on the top plate of the capacitor 204 will discharge through the diode 212 causing a still greater current flow through the diode. The additional current through the diode causes the bottom plate of the capacitor 208 and the top plate of the capacitor 214 to acquire an additional charge. Consequently, the control voltage applied to the output terminals 218 and 220 will be increased upon the application of very strong signals to the control grid 186. Thus it is seen that a normal automatic gain control voltage may be developed at the terminals 218 and 220 during the reception of signals of normal strength and an additional control voltage is developed upon the reception of strong signals.

In many receivers, it is desirable to have amplifier stages operate without an automatic gain control voltage during the reception of normal signals. However, when very strong signals are received, it is often desirable to control the gain of these amplifiers or even block their operation. The voltage developed across the terminals 222 and 224 in the circuit shown is suitable for such amplifiers.

In other receivers, it is desirable to have amplifiers operate with a normal automatic gain control voltage during the reception of signals of normal strength and to operate with an additional control voltage provided during the reception of strong signals. The control voltage developed across the terminals 218 and 220 is suitable for such amplifiers.

In the circuit shown in Figure 3, the voltage developed at the terminals 218 and 220 may, for example, be applied to a preceding intermediate frequency amplifier and the voltage developed at the terminals 222 and 224 may be applied to one of the early radio frequency amplifier stages within a receiver.

When incoming signals applied to the control grid 186 are strong enough to overcome the negative bias of the device 180, the control grid 186 and the cathode 184 may be regarded as a diode. Thus a circuit is provided which is suitable for producing a delayed automatic gain control voltage without the necessity of an additional vacuum tube or other electronic devices. While the present circuit does not provide a voltage doubling for gain control, such as the circuit shown in Figure 1, it does provide a relatively simple and inexpensive means of obtaining additional and delayed automatic gain control voltages.

Figure 4:
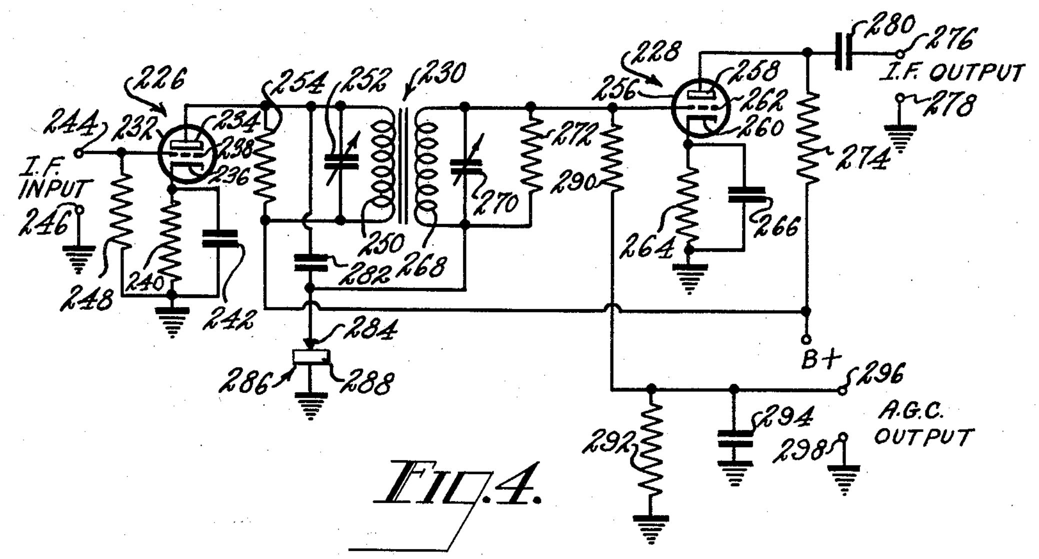
Figure 4 is a schematic circuit diagram of still another modification of an improved coupling and gain control system, in accordance with the present invention.

Referring particularly to Figure 4, a first intermediate frequency amplifier stage 226 is inductively coupled to a second intermediate frequency amplifier stage 228 through a transformer 230. The first amplifier stage includes an electron discharge device 232 having an anode 234, a cathode 236 and a control grid 238. A resistor 240 and a capacitor 242 provide self-biasing means for the electron discharge device. Input terminals 244 and 246 are provided to receive an electrical signal which is applied across a resistor 248 in the input circuit of the electron discharge device 232. A tuned output circuit includes a primary winding 250 and a variable capacitor 252. A damping resistor 254 is connected across the tuned output circuit. The anode 234 is connected to a suitable source of operating potential through the primary winding 250 and the resistor 254.

The second amplifier stage 228 includes an electron discharge device 256 having an anode 258, a cathode 260 and a control grid 262. A resistor 264 and a capacitor 266 provide self-biasing means for the electron discharge device 256. A tuned parallel input circuit to the device 256 includes the secondary winding 268 and a variable capacitor 270. A damping resistor 272 is connected across the tuned parallel circuit. The anode 258 is connected to the source of operating potential through a load resistor 274. The signal output from the second amplifier stage 228 is applied to a pair of output terminals 276 and 278 through a coupling capacitor 280.

The automatic gain control voltage circuit includes a coupling capacitor 282 connected from the top of the tuned primary winding circuit to the anode 284 of the diode 286. The cathode 288 of the diode is connected to ground. A point between the capacitor 282 and the anode 284 is connected to the grid 262 through the secondary winding tuned circuit and the resistor 272. A coupling or isolating resistor 290 is connected between the grid 262 and a filter network comprising a resistor 292 and a capacitor 294. The capacitor 294 may be regarded as a voltage storing means. Voltage developed across the capacitor 294 is applied to a pair of output terminals 296 and 298. These terminals may be connected to a previous radio frequency amplifier stage, an intermediate frequency amplifier stage or any other suitable utilization circuit.

In the embodiment shown, an incoming intermediate frequency signal passes through the two stages of amplification 226 and 228 and may be applied to still a further stage of amplification or detector stage through the output terminals 276 and 278.

In considering the automatic gain control circuit, a positive signal from the tuned primary winding 250 is applied to the diode causing the diode to conduct. During the conduction of the diode, the bottom plate of the capacitor 282 assumes a negative charge. The top plate of the capacitor 294 acquires the same negative charge since it is connected to the bottom plate of the capacitor 282 through the secondary winding 268 connected in series with resistor 290. The voltage developed across the capacitor 295 is suitably filtered by the resistor 292 and applied to the terminals 296 and 298.

When electrical signals of normal strength are applied to the grid 262, the negative bias developed by resistor 264 and capacitor 266 will be sufficient to maintain the grid 262 negative with respect to the cathode 260. However, when very strong positive signals are applied to the grid 262, the signals are sufficient to overcome the negative bias thereby driving the grid 262 positive with respect to the cathode. Under these conditions, grid current flows and a negative charge will accumulate on the top plate of the capacitor 294. The charge developed across the capacitor 294 due to grid current adds to the charge acquired from the capacitor 282. Thus, it is seen that when very strong signals are received, an additive delayed gain control voltage is developed. During the reception of signals of normal strength, this additive voltage is not present.

In the circuit shown, some balancing of the load in the coupling network is achieved during the reception of strong signals. The diode 286 is associated with the primary tuned circuit which includes the primary winding 250 and the variable capacitor 252. The grid 262 and the cathode 260 may be considered as a diode during the reception of strong signals. The grid 262 and the cathode 260 are associated with the secondary tuned circuit comprising the secondary winding 268 and the variable capacitor 270. The partial load balancing in the coupling network shown is attained without the addition of a separate diode in the secondary tuned circuit. It is noted that the partial load balancing is achieved when an unbalance is most likely to occur, which is during the reception of strong signals.

Figure 5:
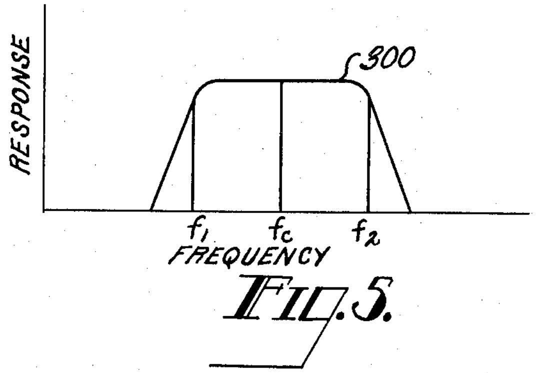
Figures 5, *5a* and *5b* are a set of curves illustrating the general frequency bandpass response of circuits embodying both the present invention and the prior art.
Figure 5A:
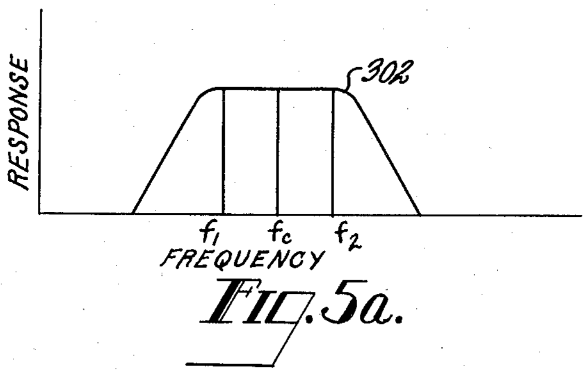
Figure 5B:
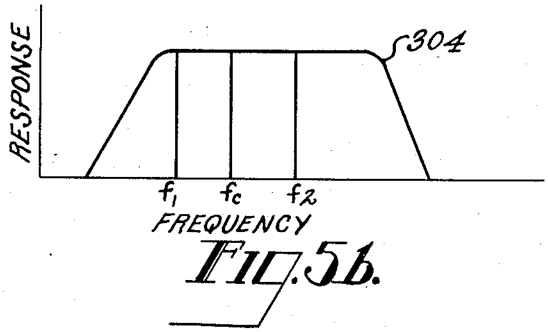

Referring particularly to Figures 5, 5*a* and 5*b*, there are shown a series of curves representing the pass band of an intermediate frequency coupling network, with $F_1$ representing the lowest frequency to be passed, $F_2$ representing the highest frequency to be passed, and $F_c$ representing the center frequency of the band to be passed by the coupling network.

Figure 5 shows a curve 300 which represents the pass band of a typical intermediate coupling network in a receiver when no electrical signals are being received. Figure 5*a* shows a curve 302 which represents the pass band of a coupling network embodying the present invention when the electrical signals received are relatively strong. Figure 5*b* shows a curve 304 which represents the pass band of a coupling network used in many prior art receivers when the received electrical signals are relatively strong. In such prior art receivers, an automatic gain control circuit was used in either the input or output circuit of the coupling network.

It is noted that the curve 302 is substantially similar to the curve 300. The same center frequency of the band is maintained with only a very slight widening of the frequency band resulting. The curve 304 illustrates the widening of the frequency band found in many prior art receivers. The unbalanced coupling network found in such receivers results in a greater widening of the frequency band on one side of the band than on the other. Under these conditions, the center frequency of the band is shifted considerably. In the example shown, it is seen that undesired signals towards the high side of the frequency band will pass through the coupling network thereby causing undesired signals in the output of the receiver.

If balancing alone is used in a coupling network, the band pass would tend to widen equally on both sides of the frequency band while still maintaining the same center frequency. However, in utilizing the novel voltage control circuits of the present invention, besides maintaining the same center frequency, an additional advantage is attained by preventing the widening of the frequency band by effectively controlling the amplification of unusually strong signals applied to the receiver.

What is claimed is:

1. An automatic gain control system comprising a coupling transformer having substantially balanced primary and secondary windings, means for applying a radio frequency signal to said primary winding, a voltage doubling circuit including a first rectifying means associated with said primary winding, a first capacitive means for coupling said primary winding to said first rectifying means, said first rectifying means being conductive during the positive portion of said radio frequency signal, means for charging said first capacitive means during the conduction of said first rectifying means, a second rectifying means connected to said secondary winding, a second capacitive means for coupling said secondary winding to said second rectifying means, means for serially connecting said first and second rectifying means, said second rectifying means being conductive during the positive portion of said radio frequency signal applied to said secondary winding from said primary winding, means for charging said second capacitive means during the conduction of said second rectifying means, means for discharging the electrical charge of said first capacitive means through said second rectifying means during said conduction of said second rectifying means whereby said said second capacitive means acquires an additional electrical charge, a voltage storage means connected to said second capacitive means, a utilization circuit, and means for applying said radio frequency signal from said secondary winding to said utilization circuit.

2. In a radio receiver, an automatic gain control circuit comprising an intermediate frequency coupling transformer having substantially balanced tuned primary and secondary windings, means for applying a radio frequency electrical signal to said primary winding, a voltage doubling circuit including a first diode, a first capacitor to couple said primary winding to said first diode, said first diode being conductive during the positive portion of said radio frequency electrical signal, means for charging said first capacitor during the conduction of said first diode having its current path serially connected with the current path of said first diode, a second diode, a second capacitor to couple said secondary winding to said second diode, said second diode being conductive during the positive portion of said radio frequency electrical signal applied thereto, means for charging said second capacitor during the conduction of said second diode, means for connecting said first capacitor to said second diode, means for discharging said first capacitor through said second diode during the conduction of said second diode, means for accumulating an additional charge at said second capacitor from the discharge of said first capacitor, a third capacitor connected to said second capacitor, means for charging said third capacitor to substantially the same charge as said second capacitor, means for connecting said third capacitor to a first utilization circuit, a second utilization circuit, and means for applying said radio frequency electrical signal from said secondary winding to said second utilization circuit.

3. In a radio receiver having intermediate frequency stages, a gain control system comprising an intermediate frequency transformer having substantially balanced tuned primary and secondary windings, a diode connected to each of said windings, means for connecting said diodes with their current paths in series and in the same direction, a capacitor connected across said diodes, means for utilizing the voltage developed across said capacitor, a mixer stage, and means for connecting said secondary winding to said mixer stage.

4. In combination with a double conversion radio receiver, an automatic gain control circuit comprising an intermediate frequency coupling network having substantially balanced tuned primary and secondary circuits, means for applying a first intermediate frequency signal to said tuned primary circuit, rectifying means connected to each of said circuits, means for serially connecting said rectifying means, voltage storage means connected across said rectifying means, means for connecting said voltage storage means to a gain controlled amplifier stage, a mixer stage including an oscillating circuit, and means for applying said first intermediate frequency signal from said secondary tuned circuit to said mixer stage whereby said first intermediate frequency signal from said tuned secondary circuit is converted to a second intermediate frequency in said double conversion radio receiver.

5. In combination with a radio receiver having a plurality of intermediate frequency amplifier stages, an automatic gain control circuit comprising an intermediate frequency coupling network having primary and secondary windings tuned to an intermediate frequency of said receiver, means for applying an alternating current signal to said coupling network, capacitive means for coupling said primary winding to said secondary winding, a first diode rectifier connected across said primary winding, a second diode rectifier connected across said secondary winding, said diodes maintaining a substantially balanced relationship between said primary and secondary windings, means for serially connecting the current paths of said diode rectifiers, in the same direction, a capacitor connected across said serially connected diodes whereby the voltage developed by the current through said diodes across said capacitor is additive to provide substantially a voltage doubling action, means for applying the voltage output from said capacitor to a gain controlled circuit, a utilization circuit subsequent to said intermediate frequency coupling network, and means for applying said alternating current signal from said coupling network to said utilization circuit.

6. In combination with a radio receiver having a plurality of intermediate frequency amplifier stages, an automatic gain control circuit comprising an intermediate frequency transformer having primary and secondary windings, means for applying a signal to said intermediate frequency transformer, means for capacitively tuning said windings to the intermediate frequency of said receiver, damping means connected across each of said windings, a first diode rectifier, a first capacitive means for coupling said first diode rectifier to said primary winding, a second diode rectifier, a second capacitive means for coupling said second diode rectifier to said secondary winding, the circuits associated with said primary and secondary windings being substantially balanced, means for serially connecting the current paths of said diode rectifiers, a third capacitive means connected across said diode rectifiers, means for applying the voltage output from said third capacitive means to a gain controlled circuit, a mixer stage subsequent to said intermediate frequency coupling network, and means for applying said signal from said intermediate frequency transformer to said mixer stage.

7. In a radio receiver, an automatic gain control network comprising first and second coupled stages, each of said stages having an input and an output circuit, a coupling transformer having substantially balanced primary and secondary windings tuned to an intermediate frequency of said radio receiver, means for applying an alternating current signal to said coupling transformer, said primary winding being included in said output circuit of said first stage and said secondary winding being included in said input circuit of said second stage, a first crystal diode connected in said output circuit of said first stage, capacitive means to couple said primary winding to said first crystal diode, a second crystal diode connected in said input circuit of said second stage, capacitive means to couple said secondary winding to said second crystal diode, means for serially connecting the space current paths of said first and second crystal diodes, voltage storing means connected across said serially connected crystal diodes whereby the combined voltage developed across said voltage storing means by the current through said crystal diodes is substantially twice the voltage developed by the current through either one of said crystal diodes, and means for applying the combined voltage output from said voltage storing means to a utilization circuit, a mixer stage including an oscillator circuit, and means for applying said alternating current signal from said coupling transformer to said mixer stage.

8. In a double conversion type radio receiver, an automatic gain control network comprising electronic means including an output circuit for amplifying a signal of a first intermediate frequency of said radio receiver, a coupling transformer having substantially balanced primary and secondary windings tuned to said first intermediate frequency, said primary winding being included in said output circuit of said electronic means, means for applying a signal of said first intermediate frequency to said primary winding, a first crystal diode connected in said output circuit of said electronic means, a first capacitor to couple said primary winding to said first crystal diode, a mixer stage including an input circuit, said secondary winding being included in said input circuit of said mixer stage whereby said signal of said first intermediate frequency is applied thereto, a second crystal diode connected in said input circuit of said mixer stage, a second capacitor to couple said secondary winding to said second crystal diode, means for serially connecting said crystal diodes, a third capacitor connected across said crystal diodes, the combined voltage developed across said third capacitor by the current flow in said crystal diodes being substantially twice the voltage developed by the current flow in either one of said crystal diodes, means for applying the combined voltage output from said third capacitor to a utilization circuit, and an oscillator circuit associated with said mixer stage, said oscillator circuit providing an electrical signal which mixes with said signal of said first intermediate frequency from secondary winding to produce an electrical signal of a second intermediate frequency in said double conversion type radio receiver.

References Cited in the file of this patent

UNITED STATES PATENTS

| | | |
|---|---|---|
| 2,121,427 | Fowler | June 21, 1938 |
| 2,153,780 | Van Loon | Apr. 11, 1939 |
| 2,247,085 | Goldman | June 24, 1941 |
| 2,500,505 | Arnold | Mar. 14, 1950 |

UNITED STATES PATENT OFFICE

CERTIFICATE OF CORRECTION

Patent No. 2,838,660 June 10, 1958

Bernard B. Bycer

It is hereby certified that error appears in the printed specification of the above numbered patent requiring correction and that the said Letters Patent should read as corrected below.

Column 1, line 72, for "again" read -- gain --; column 3, line 34, for "a nanode" read -- an anode --; column 6, line 55, for "mixed" read -- mixer --; column 10, line 23, for "capacitor 295" read -- capacitor 294 --; column 11, line 61, after "diode" insert --, a second diode --; line 63, strike out "a second diode,".

Signed and sealed this 26th day of August 1958.

(SEAL)

Attest:

KARL H. AXLINE
Attesting Officer

ROBERT C. WATSON
Commissioner of Patents